(12) United States Patent
Kim et al.

(10) Patent No.: US 10,825,393 B2
(45) Date of Patent: Nov. 3, 2020

(54) LIGHT EMITTING DIODE DISPLAY DEVICE

(71) Applicant: LG DISPLAY CO., LTD., Seoul (KR)

(72) Inventors: JinYeong Kim, Goyang-Si (KR); HyeonHo Son, Goyang-Si (KR); HanSaem Kang, Paju-Si (KR)

(73) Assignee: LG DISPLAY CO., LTD., Seoul (KR)

( * ) Notice: Subject to any disclaimer, the term of this patent is extended or adjusted under 35 U.S.C. 154(b) by 123 days.

(21) Appl. No.: 15/845,771

(22) Filed: Dec. 18, 2017

(65) Prior Publication Data

US 2018/0174519 A1 Jun. 21, 2018

(30) Foreign Application Priority Data

Dec. 19, 2016 (KR) .................. 10-2016-0173807

(51) Int. Cl.

| G09G 3/3241 | (2016.01) |
|---|---|
| H01L 27/15 | (2006.01) |
| H01L 33/06 | (2010.01) |
| H01L 33/32 | (2010.01) |
| H01L 33/60 | (2010.01) |

(Continued)

(52) U.S. Cl.
CPC ......... *G09G 3/3241* (2013.01); *G09G 3/3233* (2013.01); *H01L 27/156* (2013.01); *H01L 33/06* (2013.01); *H01L 33/32* (2013.01); *H01L 33/42* (2013.01); *H01L 33/60* (2013.01); *G09G 2300/0426* (2013.01); *G09G 2300/0814* (2013.01); *G09G 2300/0819* (2013.01); *G09G 2300/0842* (2013.01); *G09G 2300/0852* (2013.01); *G09G 2300/0861* (2013.01); *G09G 2310/0251* (2013.01); *G09G 2310/0262* (2013.01); *G09G 2330/08* (2013.01); *G09G 2330/10* (2013.01)

(58) Field of Classification Search
CPC ............... G09G 3/3241; G09G 3/3233; G09G 2300/0426; H01L 27/156; H01L 33/06; H01L 33/32; H01L 33/42; H01L 33/60
See application file for complete search history.

(56) References Cited

U.S. PATENT DOCUMENTS

| 2003/0076048 A1* | 4/2003 | Rutherford ........ G09G 3/3241 315/169.3 |
|---|---|---|
| 2005/0243037 A1 | 11/2005 | Eom et al. |
| 2006/0061525 A1 | 3/2006 | Kim et al. |

(Continued)

FOREIGN PATENT DOCUMENTS

| CN | 101286298 A | 10/2008 |
|---|---|---|
| CN | 101739947 A | 5/2010 |

(Continued)

*Primary Examiner* — Sejoon Ahn
(74) *Attorney, Agent, or Firm* — Birch, Stewart, Kolasch & Birch, LLP (57) ABSTRACT

Disclosed is a light emitting diode display device for minimizing a screen defect caused by a defect of a light emitting diode device. The light emitting diode display device includes a plurality of subpixels which each include first to Nth (where N is a natural number equal to or greater than two) light emitting diode devices emitting light with the data current and a pixel circuit including first to Nth driving transistors respectively supplying the data current corresponding to a data signal to the first to Nth light emitting diode devices.

20 Claims, 5 Drawing Sheets

(51) Int. Cl.
*H01L 33/42* (2010.01)
*G09G 3/3233* (2016.01)

(56) References Cited

U.S. PATENT DOCUMENTS

| | | | | |
|---|---|---|---|---|
| 2009/0015145 | A1* | 1/2009 | Park | G09G 3/3233 313/504 |
| 2009/0027310 | A1 | 1/2009 | Kim | |
| 2009/0146927 | A1* | 6/2009 | Wan | G09G 3/3225 345/76 |
| 2010/0127956 | A1 | 5/2010 | Kang et al. | |
| 2010/0295845 | A1* | 11/2010 | Somerville | G09G 3/3216 345/215 |
| 2011/0074838 | A1 | 3/2011 | Yamamoto et al. | |
| 2014/0367633 | A1* | 12/2014 | Bibl | G02F 1/133603 257/13 |
| 2015/0109325 | A1* | 4/2015 | Yata | G09G 3/3233 345/601 |
| 2015/0332628 | A1 | 11/2015 | Ren et al. | |
| 2016/0372514 | A1 | 12/2016 | Chang et al. | |
| 2017/0062397 | A1* | 3/2017 | Park | G09F 9/33 |

FOREIGN PATENT DOCUMENTS

| | | |
|---|---|---|
| JP | 2009-139699 A | 6/2009 |
| WO | WO 2011/082497 A1 | 7/2011 |

\* cited by examiner

LIGHT EMITTING DIODE DISPLAY DEVICE

CROSS-REFERENCE TO RELATED APPLICATIONS

This application claims the priority benefit of Korean Patent Application No. 10-2016-0173807 filed on Dec. 19, 2016, the disclosure of which is hereby incorporated by reference in its entirety.

BACKGROUND OF THE INVENTION

Field of the Invention

Embodiments of the present disclosure relate to a light emitting diode display device.

Discussion of the Related Art

Liquid crystal display (LCD) devices are being widely used as a display screen of notebook computers, tablet computers, smartphones, portable display devices, and portable information devices in addition to a display screen of television (TVs) and monitors.

LCD devices and organic light emitting display devices display an image by using thin film transistors (TFTs) as switching elements. Since the LCD devices cannot self-emit light, the LCD devices display an image by using light emitted from a backlight unit which is disposed under a liquid crystal display panel. Since the LCD devices include a backlight unit, a design of the LCD devices is limited, and luminance and a response time are reduced. Since the organic light emitting display devices include an organic material, the organic light emitting display devices are vulnerable to water, causing a reduction in reliability and lifetime.

Recently, research and development on light emitting diode display devices including a micro light emitting device are being performed. The light emitting diode display devices have high image quality and high reliability, and thus, are attracting much attention as next-generation display devices.

However, in a related art light emitting diode display device, a screen defect occurs due to a defect of a micro light emitting diode device which occurs in a process of transferring a micro light emitting device onto a TFT array substrate.

SUMMARY OF THE INVENTION

Accordingly, the present disclosure is directed to provide a light emitting diode display device that substantially obviates one or more problems due to limitations and disadvantages of the related art.

An aspect of the present disclosure is directed to provide a light emitting diode display device for minimizing a screen defect caused by a defect of a light emitting diode device.

Additional advantages and features of the disclosure will be set forth in part in the description which follows and in part will become apparent to those having ordinary skill in the art upon examination of the following or may be learned from practice of the disclosure. The objectives and other advantages of the disclosure may be realized and attained by the structure particularly pointed out in the written description and claims hereof as well as the appended drawings.

To achieve these and other advantages and in accordance with the purpose of the disclosure, as embodied and broadly described herein, there is provided a light emitting diode display device including a plurality of subpixels which each include first to Nth (where N is a natural number equal to or greater than two) light emitting diode devices emitting light with the data current and a pixel circuit including first to Nth driving transistors respectively supplying the data current corresponding to a data signal to the first to Nth light emitting diode devices.

It is to be understood that both the foregoing general description and the following detailed description of the present disclosure are by example and explanatory and are intended to provide a further explanation of the disclosure as claimed.

BRIEF DESCRIPTION OF THE DRAWINGS

The accompanying drawings, which are included to provide a further understanding of the disclosure and are incorporated in and constitute a part of this application, illustrate embodiments of the disclosure and together with the description serve to explain the principle of the disclosure. In the drawings.

DETAILED DESCRIPTION OF THE EMBODIMENTS

Reference will now be made in detail to the example embodiments of the present disclosure, examples of which are illustrated in the accompanying drawings. Wherever possible, the same reference numbers will be used throughout the drawings to refer to the same or like parts.

Advantages and features of the present disclosure, and implementation methods thereof will be clarified through following embodiments described with reference to the accompanying drawings. The present disclosure may, however, be embodied in different forms and should not be construed as limited to the embodiments set forth herein. Rather, these embodiments are provided so that this disclosure will be thorough and complete, and will fully convey the scope of the present disclosure to those skilled in the art. Furthermore, the present disclosure is only defined by the scopes of the claims.

A shape, a size, a ratio, an angle, and a number disclosed in the drawings for describing embodiments of the present disclosure are merely an example, and thus, the present disclosure is not limited to the illustrated details. Like reference numerals refer to like elements throughout. In the following description, when the detailed description of the relevant known technology is determined to unnecessarily obscure the important point of the present disclosure, the detailed description will be omitted.

In an instance where 'comprise', 'have', and 'include' described in the present specification are used, another part or an element may be added or included unless 'only~' is used. The terms of a singular form may include plural forms unless referred to the contrary.

In construing an element, the element is construed as including an error range although there is no explicit description.

In describing a position relationship, for example, when a position relation between two parts is described as 'on~', 'over~', 'under~%', and 'next~', one or more other parts may be disposed between the two parts unless 'just' or 'direct' is used.

In describing a time relationship, for example, when the temporal order is described as 'after~', 'subsequent~', 'next~', and 'before~', an instance which is not continuous may be included unless 'just' or 'direct' is used.

It will be understood that, although the terms "first", "second", etc. may be used herein to describe various elements, these elements should not be limited by these terms. These terms are only used to distinguish one element from another. For example, a first element could be termed a second element, and, similarly, a second element could be termed a first element, without departing from the scope of the present disclosure.

A first horizontal axis direction, a second horizontal axis direction, and a vertical axis direction should not be construed as only a geometric relationship where a relationship therebetween is vertical, and may denote having a broader directionality within a scope where elements of the present disclosure operate functionally.

The term "at least one" should be understood as including any and all combinations of one or more of the associated listed items. For example, the meaning of "at least one of a first item, a second item, and a third item" denotes the combination of all items proposed from two or more of the first item, the second item, and the third item as well as the first item, the second item, or the third item.

Features of various embodiments of the present disclosure may be partially or overall coupled to or combined with each other, and may be variously inter-operated with each other and driven technically as those skilled in the art can sufficiently understand. The embodiments of the present disclosure may be carried out independently from each other, or may be carried out together in co-dependent relationship.

Hereinafter, example embodiments of a light emitting diode display device according to the present disclosure will be described in detail with reference to the accompanying drawings. In the specification, in adding reference numerals for elements in each drawing, it should be noted that like reference numerals already used to denote like elements in other drawings are used for elements wherever possible.

Figure 1:
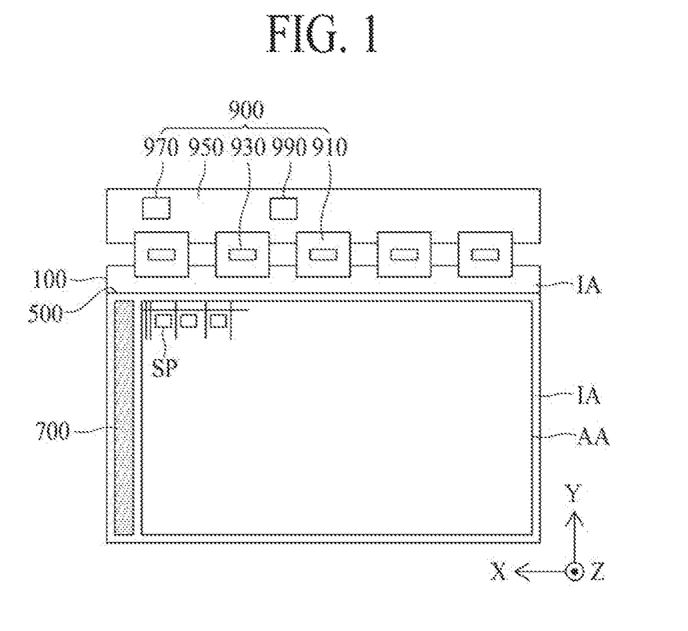
FIG. 1 is a diagram for describing a light emitting diode display device according to an embodiment of the present disclosure.
Figure 2:
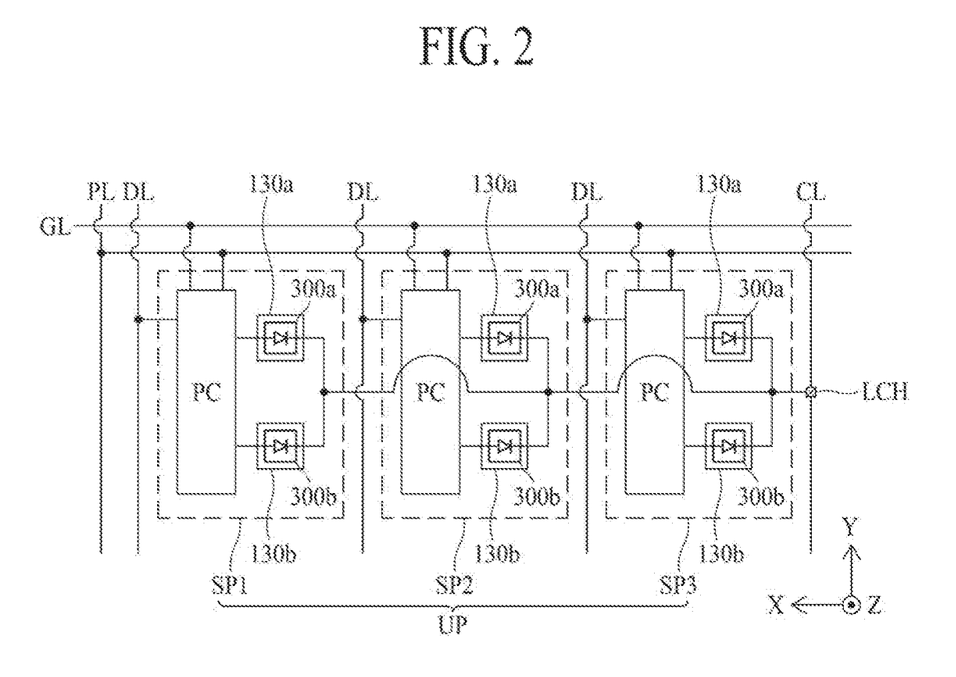
FIG. 2 is a diagram for describing a unit pixel illustrated in FIG. 1.
Figure 3:
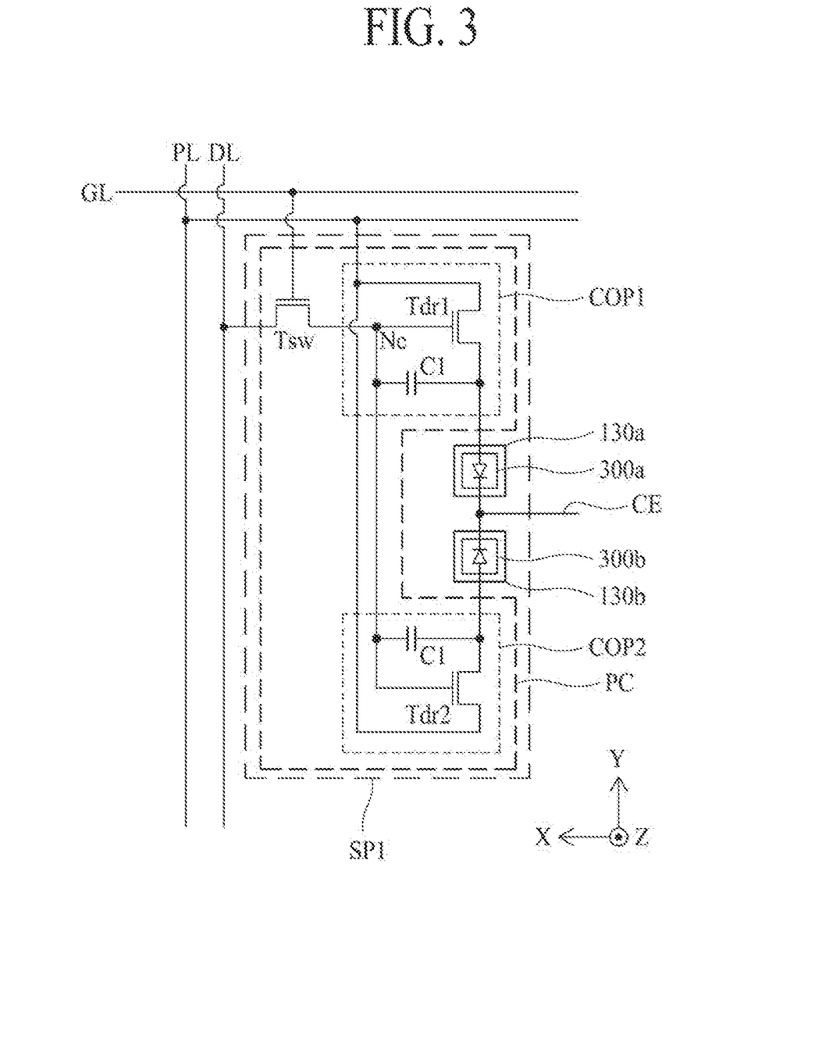
FIG. 3 is a diagram illustrating one subpixel illustrated in FIG. 2.

FIG. 1 is a diagram for describing a light emitting diode display device according to an embodiment of the present disclosure, FIG. 2 is a diagram for describing a unit pixel illustrated in FIG. 1, and FIG. 3 is a diagram illustrating one subpixel illustrated in FIG. 2.

Referring to FIGS. 1 to 3, the light emitting diode display device according to an embodiment of the present disclosure may include a first substrate 100 including a plurality of subpixels SP1 to SP3 and a second substrate 500 which is opposite-bonded to the first substrate 100 to cover the plurality of subpixels SP1 to SP3.

The first substrate 100 may be a thin film transistor (TFT) array substrate and may be formed of glass, a plastic material, and/or the like. The first substrate 100 according to an embodiment may include a display area (or an active area) AA and a non-display area (or an inactive area) IA.

The display area AA may be provided in a portion other than an edge of the first substrate 100. The display area AA may be defined as an area where a subpixel array including the plurality of subpixels SP1 to SP3 displaying an image is provided.

The non-display area IA may be provided in a portion other than the display area AA provided on the first substrate 100 and may be defined as the edge of the first substrate 100 surrounding the display area AA. The non-display area IA may be a peripheral portion outside the display area AA and cannot display an image unlike the display area AA, and moreover, the non-display area IA may be defined as an area where lines and circuits for driving the subpixel (SP) array are disposed. For example, the non-display area IA may include a first non-display area defined near an upper side of the display area AA, a second non-display area defined near a lower side of the display area AA, a third non-display area defined near a left side of the display area AA, and a fourth non-display area defined near a right side of the display area AA.

The first substrate 100 according to an embodiment may include a plurality of gate lines GL, a plurality of data lines DL, a plurality of driving power lines PL, a plurality of common power lines CL, and a plurality of subpixels SP1 to SP3.

The plurality of gate lines GL may be provided on the first substrate 100, may long extend along a first horizontal axis direction X of the first substrate 100, may be arranged along a second horizontal axis direction Y, and may be spaced apart from each other by a certain interval. In this instance, the first horizontal axis direction X may be defined as a direction parallel to a long side length direction of the first substrate 100, and the second horizontal axis direction Y may be defined as a direction parallel to a short side length direction of the first substrate 100. Alternatively, each of the first horizontal axis direction X and the second horizontal axis direction Y may be defined as a direction opposite thereto.

The plurality of data lines DL may be provided on the first substrate 100 to intersect the plurality of gate lines GL, may long extend along the second horizontal axis direction Y of the first substrate 100, may be arranged along the first horizontal axis direction X, and may be spaced apart from each other by a certain interval.

The plurality of driving power lines PL may be provided on the first substrate 100 in parallel with the plurality of data lines DL and may be formed along with the plurality of data lines DL. Each of the plurality of driving power lines PL may supply a pixel driving power, supplied from the outside, to the subpixels SP1 to SP3.

The plurality of common power lines CL may be arranged on the first substrate 100 in parallel with the plurality of data lines DL and may be formed along with the plurality of data lines DL. Each of the plurality of common power lines CL may supply a common power, supplied from the outside, to the subpixels SP1 to SP3.

Optionally, each of the plurality of common power lines CL may individually receive the common power supplied from the outside and may individually supply the common power to each of the subpixels SP1 to SP3. In this instance, a voltage level of the common power supplied to each of the subpixels SP1 to SP3 may be controlled based on an electrical characteristic change of a below-described light emitting diode device and/or an electrical characteristic change of a below-described driving TFT.

The plurality of subpixels SP1 to SP3 may be respectively provided in a plurality of pixel areas defined by intersections of the gate lines GL and the data lines DL. Each of the plurality of subpixels SP1 to SP3 may be defined as an area corresponding to a minimum unit where light is actually emitted. At least three adjacent subpixels SP1 to SP3 may configure one unit pixel UP for displaying colors. For example, the one unit pixel UP may include a red subpixel SP1, a green subpixel SP2, and a blue subpixel SP3 which are adjacent to each other, and may further include a white subpixel for enhancing luminance.

At least three subpixels SP1 to SP3 configuring a unit pixel UP according to an embodiment may share one driving power line PL, and in this instance, each of the plurality of power driving lines PL may be provided in one corresponding unit pixel of a plurality of unit pixels UP, thereby reducing the number of the driving power lines PL provided on the first substrate 100. Likewise, at least three subpixels SP1 to SP3 configuring a unit pixel UP according to an embodiment may share one common power line CL, and in this instance, each of the plurality of common power lines CL may be provided in one corresponding unit pixel of the plurality of unit pixels UP, thereby reducing the number of the common power line CL provided on the first substrate 100.

The plurality of subpixels SP1 to SP3 may each include first and second light emitting diode devices 300a and 300b which emit light with a data current, and a pixel circuit PC including first and second driving transistors Tdr1 and Tdr2 which respectively supply the data current corresponding to a data signal to the first and second light emitting diode devices 300a and 300b.

The first light emitting diode device 300a may be disposed on one side of a pixel area and may be connected to the pixel circuit PC, and thus, may emit light having brightness proportional to the data current supplied from the pixel circuit PC, namely, the first driving transistor Tdr1. The first light emitting diode device 300a according to an embodiment may be a light emitting diode chip which emits one of red light, green light, blue light, and white light. For example, the first light emitting diode device 300a may be a micro light emitting diode chip. In this instance, the micro light emitting diode chip may have a scale of 1 μm to 100 μm, but is not limited thereto.

The first light emitting diode device 300a may be disposed on a first emissive area of the pixel area and may be connected to the pixel circuit PC and a corresponding common power line CL. That is, the first light emitting diode device 300a according to an embodiment may include an anode terminal (or a first electrode) electrically connected to the pixel circuit PC and a cathode terminal (or a second electrode) electrically connected to the common power line CL. The first light emitting diode device 300a may emit light having brightness proportional to the data current supplied from the pixel circuit PC, namely, the first driving transistor Tdr1. The first light emitting diode device 300a according to an embodiment may be a light emitting diode chip which emits one of red light, green light, blue light, and white light. For example, the first light emitting diode device 300a may be a micro light emitting diode chip including a first electrode and a second electrode. Here, the micro light emitting diode chip may have a scale of 1 μm to 100 μm, but is not limited thereto.

The second light emitting diode device 300b may be disposed on a second emissive area which are adjacent to the first emissive area of the pixel area and may be connected to the pixel circuit PC and the corresponding common power line CL. That is, the second light emitting diode device 300b according to an embodiment may include an anode terminal (or a first electrode) electrically connected to the pixel circuit PC and a cathode terminal (or a second electrode) electrically connected to the common power line CL. The second light emitting diode device 300b may emit light having brightness proportional to the data current supplied from the pixel circuit PC, namely, the second driving transistor Tdr2. The second light emitting diode device 300b according to an embodiment may be a light emitting diode chip which emits the same light as light emitted from the first light emitting diode device 300a, and for example, may be a micro light emitting diode chip including an anode terminal and a cathode terminal.

One of the first and second light emitting diode devices 300a and 300b may be used as a redundancy light emitting diode device for preventing a screen defect from occurring due to an operation error caused by an electrical impact or misalignment which occurs in a process of mounting the first substrate 100.

The pixel circuit PC may be provided in a circuit area of the pixel area, may be electrically connected to a data line DL, a gate line GL, a driving power line PL, and a common power line CL which are adjacent thereto, and may supply the data current to the anode terminals of the first and second light emitting diode devices 300a and 300b in common. The pixel circuit PC may supply the data current based on a data signal, supplied through the data line DL, to the anode terminals of the first and second light emitting diode devices 300a and 300b in common in response to a gate signal supplied through the gate line GL, thereby allowing each of the first and second light emitting diode devices 300a and 300b to emit light with the data current.

The pixel circuit PC according to an embodiment may include a switching transistor Tsw, a first current output part COP1, and a second current output part COP2.

The switching transistor Tsw may include a gate electrode connected to the gate line GL, a drain electrode connected to the data line DL, and a source electrode connected to a common node Nc. In this instance, the source electrode and the drain electrode of the switching transistor Tsw may switch therebetween depending on a direction of a current. The switching transistor Tsw may be turned on according to the gate signal supplied through the gate line GL and may supply the data signal, supplied through the data line DL, to the common node Nc, namely, each of the first current output part COP1 and the second current output part COP2 in common.

The common node Nc may be shared by the first current output part COP1 and the second current output part COP2.

The first current output part COP1 may supply a data current, corresponding to the data signal supplied from the switching transistor Tsw to the common node Nc, to the first light emitting diode device 300a. The first current output part COP1 according to an embodiment may include a first driving transistor Tdr1 and a first capacitor C1.

The first driving transistor Tdr1 may include a gate electrode connected to the common electrode Nc, a drain electrode connected to the driving power line PL, and a source electrode connected to the anode terminal of the first light emitting diode device 300a. The first driving transistor Tdr1 may be turned on by a voltage of the common node Nc to control the amount of current flowing from the driving power line PL to the first light emitting diode device 300a. In other words, the first driving transistor Tdr1 may control a data current flowing from the driving power line PL to the first light emitting diode device 300a, based on the data signal supplied from the switching transistor Tsw to the common node Nc, thereby allowing the first light emitting diode device 300a to emit light having brightness proportional to the data signal.

The first capacitor C1 may be connected between the gate electrode and the source electrode (i.e., a gate-source electrode) of the first driving transistor Tdr1. That is, the first capacitor C1 may be provided to have a certain capacitance in an overlapping area between the source electrode and the common node Nc connected to the gate electrode of the first driving transistor Tdr1. The first capacitor C1 may store a voltage corresponding to the data signal supplied to the gate electrode of the first driving transistor Tdr1 and may turn on the first driving transistor Tdr1 with the stored voltage.

The second current output part COP2 may supply a data current, corresponding to the data signal supplied from the switching transistor Tsw to the common node Nc, to the second light emitting diode device 300b. The second current output part COP2 according to an embodiment may include a second driving transistor Tdr2 and a second capacitor C2.

The second driving transistor Tdr2 may include a gate electrode connected to the common electrode Nc, a drain electrode connected to the driving power line PL, and a source electrode connected to the anode terminal of the second light emitting diode device 300b. The second driving transistor Tdr2 may be turned on by the voltage of the common node Nc to control the amount of current flowing from the driving power line PL to the second light emitting diode device 300b. In other words, the second driving transistor Tdr2 may control a data current flowing from the driving power line PL to the second light emitting diode device 300b, based on the data signal supplied from the switching transistor Tsw to the common node Nc, thereby allowing the second light emitting diode device 300b to emit light having brightness proportional to the data signal.

The second driving transistor Tdr2 may be formed along with the first driving transistor Tdr1 and may have the same size as that of the first driving transistor Tdr1.

The second capacitor C2 may be connected between the gate electrode and the source electrode (i.e., a gate-source electrode) of the second driving transistor Tdr2. That is, the second capacitor C2 may be provided to have a certain capacitance in an overlapping area between the source electrode and the common node Nc connected to the gate electrode of the second driving transistor Tdr2. The second capacitor C2 may store a voltage corresponding to the data signal supplied to the gate electrode of the second driving transistor Tdr2 and may turn on the second driving transistor Tdr2 with the stored voltage.

The switching transistor Tsw and the first and second driving transistors Tdr1 and Tdr2 according to an embodiment may each be an amorphous silicon thin film transistor (TFT), a polycrystalline silicon TFT, an oxide TFT, or an organic material TFT, and each of the transistors Tsw, Tdr1, and Tdr1 may have a top gate structure, a bottom gate structure, or a double gate structure having the top gate structure and the bottom gate structure.

In the pixel circuit PC, one of the first and second current output parts COP1 and COP2 may be a redundancy pixel circuit which is previously provided in each of subpixels SP1 to SP3 for solving an operation defect of each of the first and second light emitting diode devices 300a and 300b provided in each of the subpixels SP1 to SP3.

In addition, each of the plurality of subpixels SP1 to SP3 may further include a first concave portion 130a accommodating the first light emitting diode device 300a and a second concave portion 130b accommodating the second light emitting diode device 300b.

The first concave portion 130a may be provided in the first emissive area of the pixel area defined in each of the subpixels SP1 to SP3 and may accommodate the first light emitting diode device 300a. The first concave portion 130a according to an embodiment may include a first accommodation space provided concavely from a planarization layer (or a passivation layer) which is provided to cover the pixel circuit PC. Since the first concave portion 130a accommodates the first light emitting diode device 300a, a misalignment of the first light emitting diode device 300a is minimized in a transfer process performed on the first light emitting diode device 300a, and thus, alignment precision is enhanced. Furthermore, an increase in thickness of a display device caused by a thickness (or a height) of the first light emitting diode device 300a is minimized.

The second concave portion 130b may be provided in the second emissive area of the pixel area defined in each of the subpixels SP1 to SP3 and may accommodate the second light emitting diode device 300b. The second concave portion 130b according to an embodiment may include a second accommodation space provided concavely from the planarization layer and may be provided in the same shape as that of the first concave portion 130a. Since the second concave portion 130b accommodates the second light emitting diode device 300b, a misalignment of the second light emitting diode device 300b is minimized in a transfer process performed on the second light emitting diode device 300b, and thus, alignment precision is enhanced. Furthermore, an increase in thickness of the display device caused by a thickness (or a height) of the second light emitting diode device 300b is minimized.

Optionally, the first concave portion 130a and the second concave portion 130b may communicate with each other without a boundary therebetween. That is, the accommodation space of the first concave portion 130a and the accommodation space of the second concave portion 130b may communicate with each other to configure one accommodation space, and in this instance, the subpixels SP1 to SP3 may each include one concave portion including one accommodation space where the first light emitting diode device 300a and the second light emitting diode device 300b are provided in parallel. In this instance, in a process of disposing the first light emitting diode device 300a and the second light emitting diode device 300b in the accommodation space of the concave portion, an alignment process for each of the first light emitting diode device 300a and the second light emitting diode device 300b is easily performed.

The second substrate 500 may be disposed to cover the first substrate 100 and may be defined as a color filter array substrate, an opposite substrate, or an encapsulation substrate. The second substrate 500 may be opposite-bonded to the first substrate 100 by a sealant surrounding the display area AA of the first substrate 100.

In addition, the light emitting diode display device according to an embodiment of the present disclosure may further include a gate driving circuit 700 and a panel driver 900.

The gate driving circuit 700 may generate the gate signal according to a gate control signal input from the panel driver 900 and may supply the gate signal to the gate lines GL. The gate driving circuit 700 according to an embodiment may be built into the third non-display area of the first substrate 100 through a process which is the same as a process of forming TFTs provided in each subpixel SP. For example, the gate driving circuit 700 may be provided in a left and/or right non-display area with respect to the display area AA, but is not limited thereto. In other embodiments, the gate driving circuit 700 may be provided in an arbitrary non-display area which enables the gate signal to be supplied to the gate lines GL.

Optionally, the gate driving circuit 700 may be manufactured as a driving integrated circuit (IC) type. In this instance, the gate driving circuit 700 according to an embodiment may be mounted in the third and/or fourth non-display area of the first substrate 100 so as to be connected to a plurality of gate lines in a one-to-one correspondence relationship. According to another embodiment, the gate driving circuit 700 may be mounted on a gate flexible circuit film, and in this instance, the gate flexible circuit film may be attached on a gate pad part provided in the third and/or fourth non-display area of the first substrate 100, whereby the gate driving circuit 700 may be connected to the plurality of gate lines through the gate flexible circuit film and the gate pad part in a one-to-one correspondence relationship.

The panel driver 900 may be connected to a pad part provided in the first non-display area of the first substrate 100 and may display an image, corresponding to image data supplied from a display driving system, on the display area AA. The panel driver 900 according to an embodiment may include a plurality of data flexible circuit films 910, a plurality of data driving ICs 930, a printed circuit board (PCB) 950, a timing controller 970, and a power circuit 990.

Each of the plurality of data flexible circuit films 910 may be attached on the pad part of the first substrate 100 through a film attachment process.

Each of the plurality of data driving ICs 930 may be individually mounted on a corresponding data flexible circuit film of the plurality of data flexible circuit films 910. The data driving ICs 930 may receive subpixel data and a data control signal supplied from the timing controller 970, convert the subpixel data into analog data voltages by subpixels according to the data control signal, and respectively supply the analog data voltages to the data lines DL.

The PCB 950 may be connected to the plurality of data flexible circuit films 910. The PCB 950 may support the timing controller 970 and the power circuit 990 and may transfer signals and power between the elements of the panel driver 900.

The timing controller 970 may be mounted on the PCB 950 and may receive image data and a timing synchronization signal supplied from the display driving system through a user connector provided on the PCB 950. The timing controller 970 may align the image data according to a subpixel arrangement structure of the display area AA based on the timing synchronization signal to generate subpixel data and may supply the generated subpixel data to the data driving ICs 930. Also, the timing controller 970 may generate the data control signal and the gate control signal, based on the timing synchronization signal and may control a driving timing of each of the data driving ICs 930 and the gate driver circuit 700.

The power circuit 990 may be mounted on the PCB 950 and may generate various voltages necessary for displaying an image on the display area AA by using an input power received from the outside to supply each of the voltages to a corresponding element.

The panel driver 900 may further include a control board connected to the PCB 950. In this instance, the timing controller 970 and the power circuit 990 may be mounted on the control board without being mounted on the PCB 950. Accordingly, the PCB 950 may perform only a function of transferring signals and power between the plurality of data flexible circuit films 910 and the control board.

The light emitting diode display device according to the present embodiment may include a redundancy light emitting diode device and a redundancy pixel circuit provided in each of the subpixels SP1 to SP3, thereby minimizing or preventing a screen defect caused by a defect of the light emitting diode device transferred onto each of the subpixels SP1 to SP3. Also, in the light emitting diode display device according to the present embodiment, since the first and second light emitting diode devices 300*a* and 300*b* are accommodated into at least one concave portion provided in each of the subpixels SP1 to SP3, a misalignment of the light emitting diode devices is minimized in the transfer process for the light emitting diode devices, and the light emitting diode display device has a thin thickness.

In an embodiment of the present disclosure, as shown in FIG. 3, for example, the subpixel SP1 including the first light emitting diode 300*a* and the second light emitting diode 300*b* may have first electrodes of the first and second light emitting diodes 300*a*, 300*b* being commonly connected, and second electrodes of the first and second light emitting diodes 300*a*, 300*b* being commonly connected. Also, a distance between the second electrodes of the first and second light emitting diodes 300*a*, 300*b* may be smaller than a distance between the first electrodes of the first and second light emitting diodes 300*a*, 300*b*.

Figure 4:
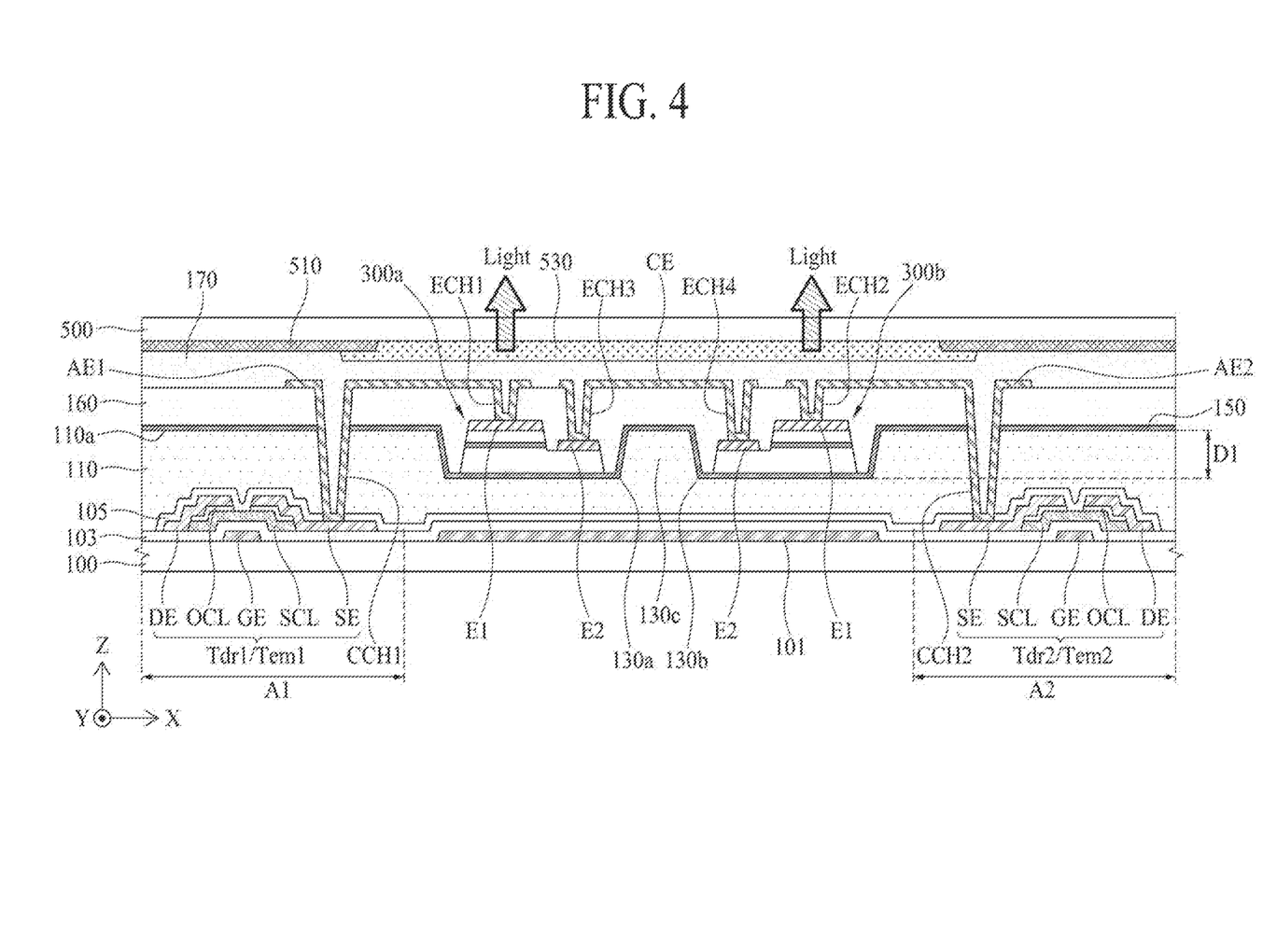
FIG. 4 is a cross-sectional view for describing a subpixel structure illustrated in FIG. 3.
Figure 5:
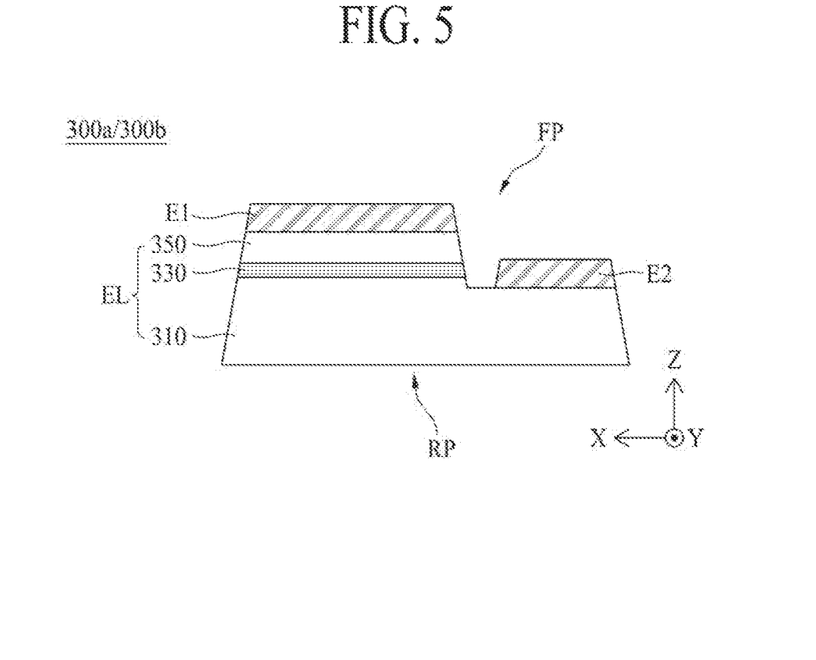
FIG. 5 is a cross-sectional view for describing a structure of a light emitting diode device illustrated in FIG. 4.

FIG. 4 is a cross-sectional view for describing a subpixel structure illustrated in FIG. 3, and FIG. 5 is a cross-sectional view for describing a structure of a light emitting diode device illustrated in FIG. 4.

Referring to FIGS. 4 and 5 along with FIG. 3, a subpixel SP of a light emitting diode display device according to the present embodiment may include a pixel circuit PC, a first planarization layer 110, first and second concave portions 130*a* and 130*b*, first and second light emitting diode devices 300*a* and 300*b*, a second planarization layer 160, a first pixel electrode AE1, a second pixel electrode AE2, and a common electrode CE.

The pixel circuit PC may include a first current output part COP1, including a switching transistor Tsw, a first driving transistor Tdr1, and a first capacitor C1, and a second current output part COP2 including a second driving transistor Tdr2 and a second capacitor C2. The pixel circuit PC is as described above, and thus, its detailed description is omitted. Hereinafter, only a structure of each of the first and second driving transistors Tdr1 and Tdr2 will be described.

The first driving transistor Tdr1 may be provided in a first circuit area A1 defined in the subpixel SP and may include a gate electrode GE, a semiconductor layer SCL, an ohmic contact layer OCL, a source electrode SE, and a drain electrode DE.

The gate electrode GE may be formed on the first substrate 100 along with the gate lines GL. The gate electrode GE may be covered by a gate insulation layer 103.

The gate insulation layer 103 may be formed of a single layer or a multilayer including an inorganic material and may be formed of silicon oxide (SiOx) silicon nitride (SiNx), and/or the like.

The semiconductor layer SCL may be provided in a predetermined pattern (or island) type on the gate insulation layer 103 to overlap the gate electrode GE. The semiconductor layer SCL may be formed of a semiconductor material including one of amorphous silicon, polycrystalline silicon, oxide, and an organic material, but is not limited thereto.

The ohmic contact layer OCL may be provided in a predetermined pattern (or island) type on the semiconductor layer SCL. In this instance, the ohmic contact layer OCL is for an ohmic contact between the semiconductor layer SCL and the source and drain electrodes SE and DE and may be omitted.

The source electrode SE may be formed on one side of the ohmic contact layer OCL to overlap one side of the semiconductor layer SCL. The source electrode SE may be formed along with the data lines DL and the driving power lines PL.

The drain electrode DE may be formed on the other side of the ohmic contact layer OCL to overlap the other side of the semiconductor layer SCL and may be spaced apart from the source electrode SE. The drain electrode DE may be formed along with the source electrode SE and may branch or protrude from an adjacent driving power line PL.

The second driving transistor Tdr2 may be provided in a second circuit area A2 defined in the subpixel SP and may include a gate electrode GE, a semiconductor layer SCL, an ohmic contact layer OCL, a source electrode SE, and a drain electrode DE. The second driving transistor Tdr2 may be formed in the same structure through the same process as the first driving transistor Tdr1, and thus, its detailed description is omitted or is briefly described below.

In addition, the switching transistor Tsw configuring the pixel circuit PC may be formed in the same structure through the same process along with the first and second driving transistors Tdr1 and Tdr2. In this instance, the gate electrode of the switching transistor Tsw may branch or protrude from the gate line GL, the drain electrode of the switching transistor Tsw may branch or protrude from the data line DL, and the source electrode of the switching transistor Tsw may be connected to the common node Nc, connected to the gate electrode GE of each of the first and second driving transistors Tdr1 and Tdr2, through a via hole provided in the gate insulation layer 103.

The pixel circuit PC may be covered by an interlayer insulation layer 105. The interlayer insulation layer 105 may be provided all over the first substrate 100 to cover the pixel circuit PC. The interlayer insulation layer 105 according to an embodiment may be formed of an inorganic material, such as SiOx or SiNx, or an organic material such as benzocyclobutene or photo acryl. The interlayer insulation layer 105 may be not provided.

The first planarization layer (or the passivation layer) 110 may be provided all over the first substrate 100 to cover the subpixel SP (i.e., the pixel circuit PC), or may be provided all over the first substrate 100 to cover the interlayer insulation layer 105. The first planarization layer 110 may protect the pixel circuit PC and may provide a planar surface on the interlayer insulation layer 105.

The first planarization layer 110 according to an embodiment may be formed of an organic material such as benzocyclobutene or photo acryl, and particularly, may be formed of photo acryl for convenience of a process.

The first concave portion 130a may be provided in a first emissive area defined in the subpixel SP and may accommodate the first light emitting diode device 300a. The first concave portion 130a according to an embodiment may be concavely provided to have a certain depth D1 from the first planarization layer 110. In this instance, the first concave portion 130a may include a first accommodation space which is provided concavely from a top 110a of the first planarization layer 110 to have the depth D1 corresponding to a thickness (or a total height) of the first light emitting diode device 300a. In this instance, a floor surface of the first concave portion 130a may be formed by removing a portion of the first planarization layer 110, a whole portion of the first planarization layer 110, the whole portion of the first planarization layer 110 and a portion of the interlayer insulation layer 105, or a whole portion of each of the first planarization layer 110, the interlayer insulation layer 105, and the gate insulation layer 103, in order to have the depth D1 which is set based on the thickness of the first light emitting diode device 300a. For example, the first concave portion 130a may be provided to have a depth of 2 μm to 6 μm from the top 110a of the first planarization layer 110. The first concave portion 130a may have a groove or cup shape having a size which is wider than a rear surface (or a bottom) of the first light emitting diode device 300a.

The second concave portion 130b may be provided in a second emissive area defined in the subpixel SP and may accommodate the second light emitting diode device 300b. The second concave portion 130b according to an embodiment may include a second accommodation space which is concavely provided to have the certain depth D1 from the first planarization layer 110. The second concave portion 130b may be formed in the same shape simultaneously with the first concave portion 130a, and thus, its detailed description is omitted.

In addition, the first concave portion 130a and the second concave portion 130b may communicate with each other without a boundary 130c therebetween. That is, the accommodation space of the first concave portion 130a and the accommodation space of the second concave portion 130b may communicate with each other to configure one accommodation space, and in this instance, the subpixels SP1 to SP3 may each include one concave portion. In this instance, the first light emitting diode device 300a may be accommodated into one region of the concave portion, and the second light emitting diode device 300b may be accommodated into the other region of the concave portion in parallel with the first light emitting diode device 300a. Therefore, according to the present embodiment, in a process of disposing the first light emitting diode device 300a and the second light emitting diode device 300b in the accommodation space of the concave portion, an alignment process for each of the first light emitting diode device 300a and the second light emitting diode device 300b is easily performed. Also, according to the present embodiment, a light-oriented angle of each of the first light emitting diode device 300a and the second light emitting diode device 300b disposed in the concave portion increases, and thus, a dark portion between the first light emitting diode device 300a and the second light emitting diode device 300b is minimized, thereby minimizing hot spots caused by the dark portion between the first light emitting diode device 300a and the second light emitting diode device 300b.

The first light emitting diode device 300a and the second light emitting diode device 300b may each include a light emitting layer EL, a first electrode (or an anode terminal) E1, and a second electrode (or a cathode terminal) E2.

The light emitting layer EL may emit light according to a recombination of an electron and a hole based on a current flowing between the first electrode E1 and the second electrode E2. The light emitting layer EL according to an embodiment may include a first semiconductor layer 310, an active layer 330, and a second semiconductor layer 350.

The first semiconductor layer 310 may supply an electron to the active layer 330. The first semiconductor layer 310 according to an embodiment may be formed of an n-GaN-based semiconductor material, and examples of the n-GaN-based semiconductor material may include GaN, AlGaN, InGaN, AlInGaN, etc. In this instance, silicon (Si), germanium (Ge), selenium (Se), tellurium (Te), or carbon (C) may be used as impurities used for doping of the first semiconductor layer 310.

The active layer 330 may be provided on one side of the first semiconductor layer 310. The active layer 330 may have a multi quantum well (MQW) structure which includes a well layer and a barrier layer which is higher in band gap than the well layer. The active layer 330 according to an embodiment may have an MQW structure of InGaN/GaN or the like.

The second semiconductor layer 350 may be provided on the active layer 330 and may supply a hole to the active layer 330. The second semiconductor layer 350 according to an embodiment may be formed of a p-GaN-based semiconductor material, and examples of the p-GaN-based semiconductor material may include GaN, AlGaN, InGaN, AlInGaN, etc. In this instance, magnesium (Mg), zinc (Zn), or beryllium (Be) may be used as impurities used for doping of the second semiconductor layer 350.

The first electrode E1 may be provided on the second semiconductor layer 350. The first electrode E1 may be connected to the source electrode SE of each of the first and second driving transistors Tdr1 and Tdr2.

The second electrode E2 may be provided on the other side of the first semiconductor layer 310 and may be electrically and/or physically disconnected or separated from the active layer 330 and the second semiconductor layer 350. The second electrode E2 may be connected to the common power line CL.

Each of the first and second electrodes E1 and E2 according to an embodiment may be formed of a material including one or more materials of a metal material, such as gold (Au), tungsten (W), platinum (Pt), silicon (Si), iridium (Ir), silver (Ag), copper (Cu), nickel (Ni), titanium (Ti), or chromium (Cr), and an alloy thereof. In other embodiments, each of the first and second electrodes E1 and E2 may be formed of a transparent conductive material, and examples of the transparent conductive material may include indium tin oxide (ITO), indium zinc oxide (IZO), etc. However, the present embodiment is not limited thereto.

In addition, the first semiconductor layer 310, the active layer 330, and the second semiconductor layer 350 may be provided in a structure of being sequentially stacked on a semiconductor substrate. In this instance, the semiconductor substrate may include a semiconductor material included in a sapphire substrate or a silicon substrate. The semiconductor substrate may be used as a growth semiconductor substrate for growing each of the first semiconductor layer 310, the active layer 330, and the second semiconductor layer 350, and then, may be separated from the first semiconductor layer 310 through a substrate separation process. In this instance, the substrate separation process may be a laser lift-off process or a chemical lift-off process. Therefore, since the growth semiconductor substrate is removed from the first and second light emitting diode devices 300a and 300b, each of the first and second light emitting diode devices 300a and 300b has a thin thickness, and thus, may be accommodated into the concave portion provided in the subpixel SP.

Each of the first and second light emitting diode devices 300a and 300b may emit light according to a recombination of an electron and a hole based on a current flowing between the first electrode E1 and the second electrode E2. In this instance, the light emitted from each of the first and second light emitting diode devices 300a and 300b may pass through the first and second electrodes E1 and E2 and may be output to the outside. In other words, the light emitted from each of the first and second light emitting diode devices 300a and 300b may pass through the first and second electrodes E1 and E2 and may be output in a second direction opposite to a first direction toward the floor surface of each of the concave portions 130a and 130b, thereby displaying an image.

Each of the first and second light emitting diode devices 300a and 300b may include a first portion FP, including the first and second electrodes E1 and E2 connected to the pixel circuit PC, and a second portion RP opposite to the first portion FP. In this instance, the first portion FP may be disposed relatively farther away from the floor surface of the concave portion than the second portion RP. That is, the first and second electrodes E1 and E2 provided in the first portion FP may be disposed to face the second substrate 500 without being disposed to face the floor surface of the concave portion. In this instance, the first portion FP may have a size which is smaller than the second portion RP, and in this instance, each of the first and second light emitting diode devices 300a and 300b may have a cross-sectional surface having a trapezoid shape which includes an upper surface corresponding to the first portion FP and a lower surface corresponding to the second portion RP.

The second planarization layer 160 may be provided on the first planarization layer 110 to cover the first and second light emitting diode devices 300a and 300b. That is, the second planarization layer 160 may be provided on the first planarization layer 110 to have a thickness for covering a top of the first planarization layer 110, the other first accommodation space of the first concave portion 130a with the first light emitting diode device 300a accommodated thereinto, the other second accommodation space of the second concave portion 130b with the second light emitting diode device 300b accommodated thereinto, a front surface of the first light emitting diode device 300a, and a front surface of the second light emitting diode device 300b.

The second planarization layer 160 may provide a planar surface on the first planarization layer 110. Also, the second planarization layer 160 may bury the other first accommodation space of the first concave portion 130a with the first light emitting diode device 300a accommodated thereinto and the other second accommodation space of the second concave portion 130b with the second light emitting diode device 300b accommodated thereinto to fix a position of each of the first light emitting diode device 300a and the second light emitting diode device 300b.

The first pixel electrode AE1 may electrically connect the first electrode E1 of the first light emitting diode device 300a to the source electrode SE of the first driving transistor Tdr1 and may be defined as a first anode electrode. The first pixel electrode AE1 according to an embodiment may be provided on the second planarization layer 160 overlapping the first driving transistor Tdr1 and the first electrode E1 of the first light emitting diode device 300a. The first pixel electrode AE1 may be electrically connected to the source electrode SE of the first driving transistor Tdr1 through a first circuit contact hole CCH1 which is provided to pass through the interlayer insulation layer 105, the first planarization layer 110, and the second planarization layer 160, and may be electrically connected to the first electrode E1 of the first light emitting diode device 300a through a first electrode contact hole ECH1 provided in the second planarization layer 160. Therefore, the first electrode E1 of the first light emitting diode device 300a may be electrically connected to the source electrode SE of the first driving transistor Tdr1 through the first pixel electrode AE1.

The second pixel electrode AE2 may electrically connect the first electrode E1 of the second light emitting diode device 300b to the source electrode SE of the second driving transistor Tdr2 and may be defined as a second anode electrode. The second pixel electrode AE2 according to an embodiment may be provided on the second planarization layer 160 overlapping the second driving transistor Tdr2 and the first electrode E1 of the second light emitting diode device 300b. The second pixel electrode AE2 may be electrically connected to the source electrode SE of the second driving transistor Tdr2 through a second circuit contact hole CCH2 which is provided to pass through the interlayer insulation layer 105, the first planarization layer 110, and the second planarization layer 160, and may be electrically connected to the first electrode E1 of the second light emitting diode device 300b through a second electrode contact hole ECH2 provided in the second planarization layer 160. Therefore, the first electrode E1 of the second light emitting diode device 300b may be electrically connected to the source electrode SE of the second driving transistor Tdr2 through the second pixel electrode AE2.

In this manner, if the light emitting diode display device has a top emission structure, each of the first and second pixel electrodes AE1 and AE2 may be formed of a transparent conductive material, and if the light emitting diode display device has a bottom emission structure, the pixel electrode AE may be formed of a light reflection conductive material. In this instance, the transparent conductive material may be indium tin oxide (ITO), indium zinc oxide (IZO), or the like, but is not limited thereto. The light reflection conductive material may be Al, Ag, Au, Pt, Cu, or the like, but is not limited thereto. Each of the first and second pixel electrodes AE1 and AE2 including the light reflection conductive material may be formed of a single layer including the light reflection conductive material or a multilayer including a plurality of the single layers which are stacked.

The common electrode CE may be electrically connected to the second electrode E2 of the first light emitting diode device 300a and the common power line CL and may be defined as a cathode electrode. The common electrode CE may be provided on the second planarization layer 160 overlapping the second electrode E2 of each of the first and second light emitting diode devices 300a and 300b and the common power line CL. In this instance, the common electrode CE may be formed of a material which is the same as that of the pixel electrode AE.

One side of the common electrode CE according to an embodiment may be electrically connected to the common power line CL through a line contact hole LCH (see FIG. 2) which is provided to pass through the gate insulation layer 103, the interlayer insulation layer 105, the first planarization layer 110, and the second planarization layer 160 which overlap the common power line CL. The other side of the common electrode CE according to an embodiment may be electrically connected to the second electrode E2 of the first light emitting diode electrode 300a through a third electrode contact hole ECH3 which is provided in the second planarization layer 160 to overlap the second electrode E2 of the first light emitting diode electrode 300a, and may be electrically connected to the second electrode E2 of the second light emitting diode electrode 300b through a fourth electrode contact hole ECH4 which is provided in the second planarization layer 160 to overlap the second electrode E2 of the second light emitting diode electrode 300b. Therefore, each of the second electrode E2 of the first light emitting diode electrode 300a and the second electrode E2 of the second light emitting diode electrode 300b may be electrically connected to the common power line CL through the common electrode CE.

The first and second pixel electrodes AE1 and AE2 and the common electrode CE may be simultaneously provided through an electrode patterning process using a lithography process, an etching process, and a deposition process of depositing an electrode material on the second planarization layer 160 including the first and second circuit contact holes CCH1 and CCH2, the line contact hole, and the first to fourth electrode contact holes ECH1 to ECH4. Therefore, in the present embodiment, since the first and second pixel electrodes AE1 and AE2 and the common electrode CE connecting the first and second light emitting diode devices 300a and 300b to the pixel circuit PC are simultaneously formed, an electrode connection process is simplified, and a process time taken in a process of connecting the first and second light emitting diode devices 300a and 300b to the pixel circuit PC is considerably shortened, thereby enhancing a productivity of the light emitting diode display device.

The light emitting diode display device according to the present embodiment may further include a second substrate 500.

The second substrate 500 may be disposed to cover a portion other than the pad part of the first substrate 100, thereby protecting a pixel array provided on the first substrate 100. The second substrate 500 may be defined as a color filter array substrate, an opposite substrate, or an encapsulation substrate. For example, the second substrate 500 according to an embodiment may be formed of a transparent glass material, a transparent plastic material, and/or the like, but is not limited thereto.

The second substrate 500 according to an embodiment may include a black matrix 510.

The black matrix 510 may define an opening area of each subpixel SP provided on the first substrate 100. That is, the black matrix 510 may be provided in the light blocking area of the second substrate 500 overlapping an area other than the opening area overlapping the emissive area of each subpixel SP, thereby preventing color mixture between adjacent opening areas. The black matrix 510 according to an embodiment may include a plurality of first light blocking patterns which cover the plurality of gate lines GL, the plurality of common power lines CL, and the pixel circuit PC of each subpixel SP, a plurality of second light blocking patterns which cover the plurality of data lines DL and the plurality of driving power lines PL, and a third light blocking pattern which covers an edge of the second substrate 500. In this instance, the first to third light blocking patterns may be provided on the same layer, and thus, the black matrix 510 may have a mesh form.

In addition, the second substrate 500 may further include a light extraction layer 530 provided in the opening area defined by the black matrix 510. The light extraction layer 530 may be formed of a transparent material and may externally extract light emitted from the emissive area of each subpixel SP. The light extraction layer 530 minimizes a step height between the opening area and the black matrix 510 provided on the second substrate 500.

In an instance where each of the first and second light emitting diode devices 300a and 300b disposed in each subpixel SP emits white light, the second substrate 500 may include a color filter layer 530 provided in the opening area, instead of the light extraction layer 530.

The color filter layer 530 may include a color filter having a color corresponding to a color defined in each subpixel SP. The color filter layer 530 may transmit only light, having a wavelength of a color corresponding to a corresponding subpixel SP, of the white light emitted from the corresponding subpixel SP.

The light emitting diode display device according to an embodiment of the present disclosure may further include an encapsulation layer 170 disposed between the first substrate 100 and the second substrate 500. The encapsulation layer 170 may be an optical clear adhesive (OCA) or an optical clear resin (OCR), but is not limited thereto.

The light emitting diode display device according to the present embodiment may further include a reflective layer 101 provided under the emissive area of each subpixel SP.

The reflective layer 101 may be disposed between the floor surface of each of the concave portions 130a and 130b and the first substrate 100 to overlap the emissive area including the first and second light emitting diode devices 300a and 300b. The reflective layer 101 according to an embodiment may be formed of a material which is the same as that of the gate electrode GE of the driving transistors Tdr1 and Tdr2, and may be provided on the same layer as the gate electrode GE. The reflective layer 101 may reflect light, which is incident from each of the first and second light emitting diode devices 300a and 300b, toward the second substrate 500. Accordingly, the light emitting diode display device according to the present embodiment may include the reflective layer 101, and thus, may have a top emission structure.

Optionally, the reflective layer 101 may be formed of a material which is the same as that of the source/drain electrode SE/DE of each of the driving transistors Tdr1 and Tdr2, and may be provided on the same layer as the source/drain electrode SE/DE.

In the light emitting diode display device according to the present embodiment, the first and second light emitting diode devices 300a and 300b of each subpixel SP may be adhered to the floor surface of each of the concave portions 130a and 130b by an adhesive member 150.

The adhesive member 150 may be disposed between the first and second light emitting diode devices 300a and 300b and the concave portions 130a and 130b of each subpixel SP and may attach each of the first and second light emitting diode devices 300a and 300b onto the floor surface of a corresponding concave portion of the concave portions 130a and 130b, thereby primarily fixing each of the first and second light emitting diode devices 300a and 300b.

The adhesive member 150 according to an embodiment may be attached (coated) on the second portion RP of each of the first and second light emitting diode devices 300a and 300b (i.e., a back surface of the first semiconductor layer 310), and thus, in a mounting process of mounting the light emitting diode device, the adhesive member 150 may be adhered to the floor surface of the first concave portion 130a and the floor surface of the second concave portion 130b.

According to another embodiment, the adhesive member 150 may be dotted onto the floor surface of the first concave portion 130a and the floor surface of the second concave portion 130b and may be spread by pressure which is applied thereto in a mounting process performed for the light emitting diode device, and thus, may be adhered to the second portion RP of each of the first and second light emitting diode devices 300a and 300b. Therefore, the first light emitting diode device 300a mounted on the first concave portion 130a may be primarily position-fixed by the adhesive member 150. Accordingly, according to the present embodiment, the mounting process for the light emitting diode device may be performed in a method of simply attaching each of the first and second light emitting diode devices 300a and 300b onto the floor surface of a corresponding concave portion of the concave portions 130a and 130b, and thus, a mounting process time taken in performing the mounting process for the light emitting diode device is shortened.

In other embodiments, the adhesive member 150 may be coated on the top 110a of the first planarization layer 110, the floor surface and an inclined surface of the first concave portion 130a, and the floor surface and an inclined surface of the second concave portion 130b. That is, the adhesive member 150 may be provided to wholly cover a portion of a front surface of the first planarization layer 110 except the contact holes. In other words, the adhesive member 150 may be disposed between the first planarization layer 110 and the second planarization layer 160 and may be disposed between the first planarization layer 110 and each of the first light emitting diode devices 300a and 300b. In other embodiments, the adhesive member 150 may be coated on the whole top 110a of the first planarization layer 110, where the concave portions 130a and 130b are provided, to a certain thickness. A portion of the adhesive member 150 coated on the top 110a of the first planarization layer 110, where the contact holes are to be provided, may be removed when forming the contact holes. Therefore, in the present embodiment, immediately before a mounting process for the light emitting diode device, the adhesive member 150 may be coated on the whole top 110a of the first planarization layer 110 to have a certain thickness, and thus, according to the present embodiment, a process time taken in forming the adhesive member 150 is shortened.

In the present embodiment, the adhesive member 150 may be provided on the whole top of the first planarization layer 110, and thus, the second planarization layer 160 according to the present embodiment is provided to cover the adhesive member 150.

A mounting process for a light emitting diode device according to an embodiment may include a process of mounting red first and second light emitting diode devices on each of red subpixels SP1, a process of mounting green first and second light emitting diode devices on each of green subpixels SP2, and a process of mounting blue first and second light emitting diode devices on each of blue subpixels SP3, and moreover, may further include a process of mounting white first and second light emitting diode devices on each of white subpixels.

The mounting process for the light emitting diode device according to an embodiment may include only a process of mounting the white first and second light emitting diode devices on each of subpixels. In this instance, the first substrate 100 or the second substrate 500 may include a color filter layer overlapping each subpixel. The color filter layer may transmit only light, having a wavelength of a color corresponding to a corresponding subpixel, of white light.

The mounting process for the light emitting diode device according to an embodiment may include only a process of mounting first and second light emitting diode devices having a first color on each subpixel. In this instance, the first substrate 100 or the second substrate 500 may include a wavelength conversion layer and the color filter layer overlapping each subpixel. The wavelength conversion layer may emit light of a second color, based on some of light of the first color incident from the first and second light emitting diode devices having the first color. The color filter layer may transmit only light, having a wavelength of a color corresponding to a corresponding subpixel, of white light based on a combination of the light of the first color and the light of the second color. In this instance, the first color may be blue, and the second color may be yellow.

Figure 6:
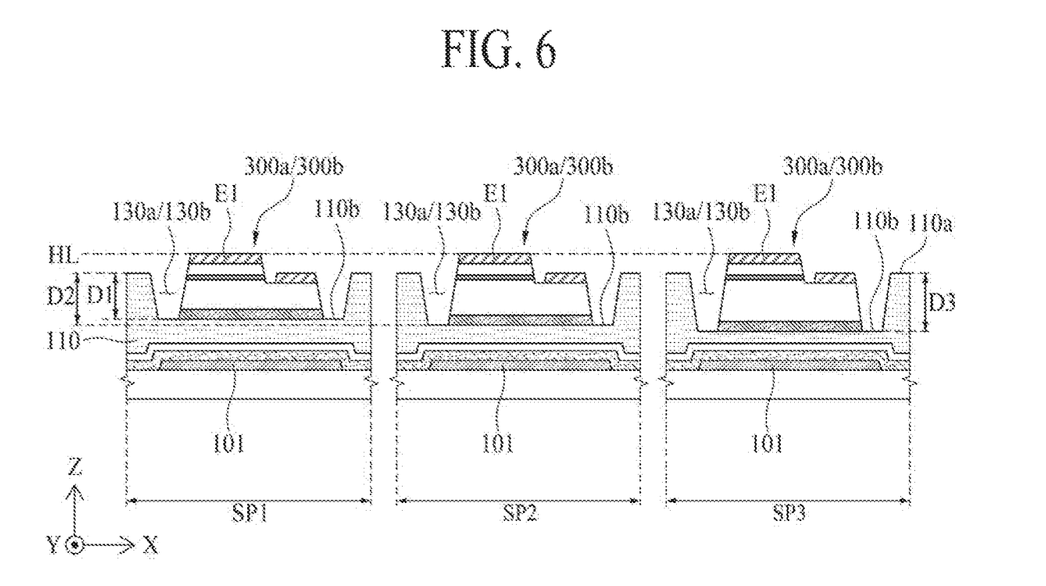
FIG. 6 is a diagram for describing a modification embodiment of a concave portion illustrated in FIG. 2.

FIG. 6 is a diagram for describing a modification embodiment of the concave portion illustrated in FIG. 2.

Referring to FIG. 6, first and second concave portions 130a and 130b provided in each of a plurality of subpixels SP according to the modification embodiment may have the same depth and may be provided concavely from a first planarization layer 110 to have different depths D1 to D3 in each subpixel SP. In this instance, the depths D1 to D3 of each of the first and second concave portions 130a and 130b may be defined as a distance between a top 110a of the first planarization layer 110 and a floor surface 110b of each of the first and second concave portions 130a and 130b.

The first concave portion 130a provided in each subpixel SP may be provided to have the different depths D1 to D3 in each of at least three adjacent subpixels SP1 to SP3 configuring one unit pixel UP. That is, the first concave portions 130a may be provided to have the different depths D1 to D3 from the first planarization layer 110, based on a height of a light emitting diode device which is to be provided in a corresponding subpixel, thereby removing or minimizing a height deviation (or a step height) between light emitting diode devices by colors. The second concave portion 130b provided in each subpixel SP may be formed to have the same shape and depth as those of the first concave portion 130a.

In order to realize a color image, the light emitting diode display device according to the present embodiment may include a red subpixel SP1, a green subpixel SP2, and a blue subpixel SP3, and the light emitting diode device may be provided by colors and may be disposed in the first and second concave portions 130a and 130b provided in a subpixel having a corresponding color. In this instance, the color-based light emitting diode devices may have different heights (or thicknesses) due to a process error of a manufacturing process. For example, thicknesses of the color-based light emitting diode devices may be thickened in the order of red, green, and blue. In this instance, the depths D1 to D3 of the first and second concave portions 130a and 130b may be deeply provided in the order of the red subpixel SP1, the green subpixel SP2, and the blue subpixel SP3, based on a height of a corresponding light emitting diode device.

Therefore, in the present embodiment, the depths of the first and second concave portions 130a and 130b provided in each subpixel may be differently set based on a height (or a thickness) of the light emitting diode device which is to be provided in a corresponding subpixel, and thus, uppermost surfaces (for example, tops of first electrodes E1) of light emitting diode devices 300a and 300b disposed in each subpixel may be disposed on the same horizontal line HL, thereby preventing an open defect, where first electrodes (or second electrodes) of the light emitting diode devices are not exposed, from occurring due to a thickness deviation between color-based light emitting diode devices in a patterning process for first and second electrode contact holes. Also, in the present embodiment, in the top emission structure, an optical distance between a reflective layer 101 and the light emitting diode device of each subpixel is optimized by using the first and second concave portions 130a and 130b which are provided to the different depths D1 to D3 in each subpixel, and thus, a reflection efficiency of the reflective layer 101 is improved, thereby maximizing a light efficiency of each of the light emitting diode devices.

Figure 7:
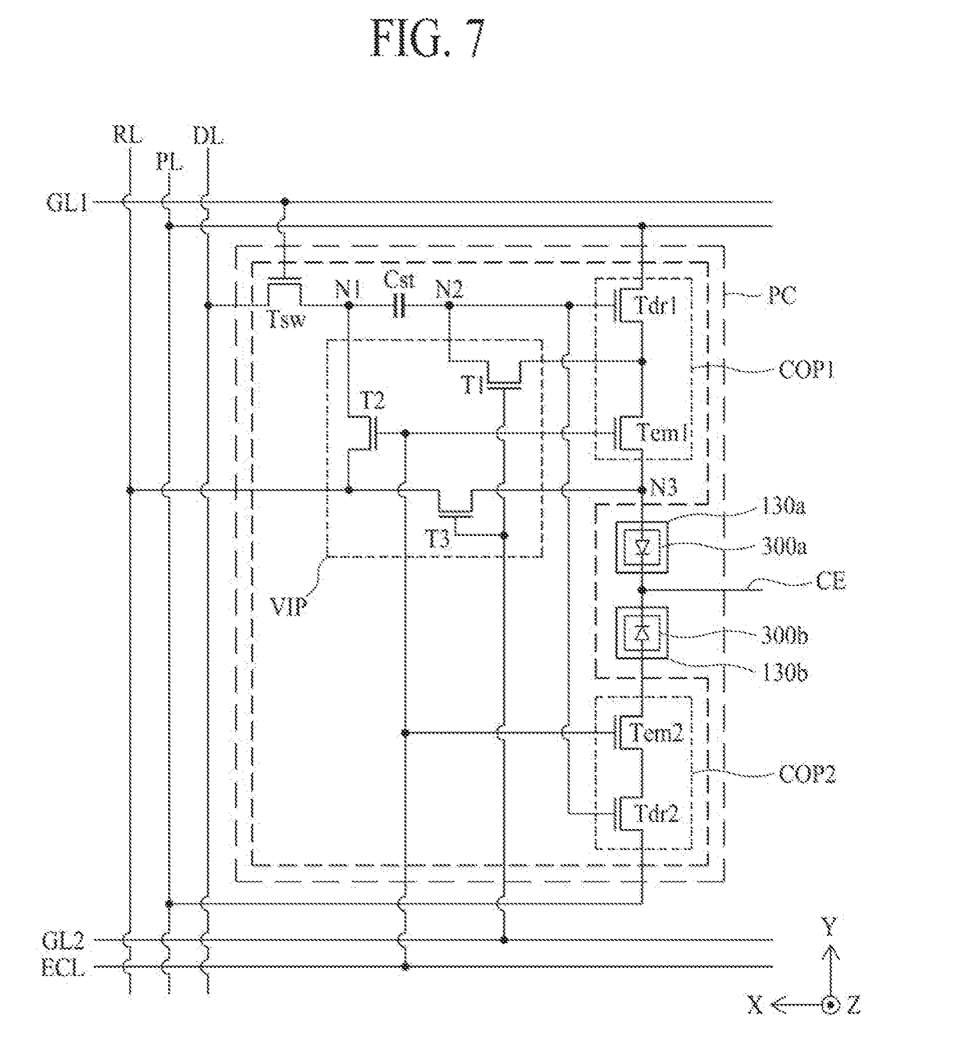
FIG. 7 is a diagram for describing a subpixel according to an embodiment of the present disclosure illustrated in FIG. 2.

FIG. 7 is a diagram for describing the subpixel according to an embodiment of the present disclosure illustrated in FIG. 2 and illustrates an example where a configuration of a pixel circuit is modified. Hereinafter, therefore, a pixel circuit and elements relevant thereto will be described, and descriptions of the other elements are not repeated.

Referring to FIG. 7 along with FIG. 1, the pixel circuit PC of each subpixel according to the present embodiment may include a switching transistor Tsw, a storage capacitor Cst, a first current output part COP1, a second current output part COP2, and a voltage initialization part VIP.

The switching transistor Tsw may include a gate electrode connected to a first gate line GL1, a drain electrode connected to a data line DL, and a source electrode connected to a first node N1. In this instance, the source electrode and the drain electrode of the switching transistor Tsw may switch therebetween depending on a direction of a current. During a sampling period, the switching transistor Tsw may be turned on according to a first gate signal supplied through the first gate line GL1 and may supply a data signal, supplied through the data line DL, to the first node N1.

The storage capacitor Cst may include a first terminal connected to the first node N1 and a second terminal connected to the second node (or a common node) N2. That is, the storage capacitor Cst may be provided to have a certain capacitance in an overlapping area between the first node N1, connected to the source electrode of the switching transistor Tsw, and the second node N2 connected to the gate electrode of a first driving transistor Tdr1. The storage capacitor Cst may store a difference voltage between the first node N1 and the second node N2 and may supply the stored voltage to the first current output part COP1 and the second current output part COP2 in common. In more detail, the storage capacitor Cst may store a voltage corresponding to the data signal from the switching transistor Tsw and may supply the stored voltage to the first current output part COP1 and the second current output part COP2 in common.

The first current output part COP1 may be turned on by the voltage corresponding to the data signal supplied from the storage capacitor Cst to the second node N2 and may supply a data current to a first light emitting diode device 300a. The first current output part COP1 may include the first driving transistor Tdr1.

The first driving transistor Tdr1 may include a gate electrode connected to the second node N2, a drain electrode connected to a driving power line PL, and a source electrode connected to an anode terminal of the first light emitting diode device 300a. The first driving transistor Tdr1 may be turned on by a voltage of the second node N2 to control the amount of current flowing from the driving power line PL to the first light emitting diode device 300a.

The first current output part COP1 according to an embodiment may further include a first emission control transistor Tem1 connected between the first driving transistor Tdr1 and the first light emitting diode device 300a.

The first emission control transistor Tem1 may include a gate electrode connected to an emission control line ECL, a drain electrode connected to the source electrode of the first driving transistor Tdr1, and a source electrode connected to an anode terminal of the first light emitting diode device 300a. During a pre-initialization period for pre-initializing the source electrode of the first driving transistor Tdr1, the first emission control transistor Tem1 may be turned on by an emission control signal supplied through the emission control line ECL and may provide a path for pre-initializing the source electrode of the first driving transistor Tdr1 to a reference voltage Vref. Also, during an emission period, the first emission control transistor Tem1 may be turned on by the emission control signal supplied through the emission control line ECL and may supply a data current, output from the first driving transistor Tdr1, to the first light emitting diode device 300a.

The source electrode of the first emission control transistor Tem1, as illustrated in FIG. 4, may be connected to, through a first pixel electrode AE1, a first electrode E1 of the first light emitting diode device 300a disposed in a first concave portion 130a.

The second current output part COP2 may be turned on by the voltage corresponding to the data signal supplied from the storage capacitor Cst to the second node N2 and may supply a data current to a second light emitting diode device 300b. The second current output part COP2 according to an embodiment may include a second driving transistor Tdr2.

The second driving transistor Tdr2 may include a gate electrode connected to the second node N2, a drain electrode connected to the driving power line PL, and a source electrode connected to a first electrode of the second light emitting diode device 300b. The second driving transistor Tdr2 may be turned on by a voltage of the second node N2 to control the amount of current flowing from the driving power line PL to the second light emitting diode device 300b.

The second driving transistor Tdr2 may be formed along with the first driving transistor Tdr1 and may have the same size as that of the first driving transistor Tdr1.

The second current output part COP2 according to an embodiment may further include a second emission control transistor Tem2 connected between the second driving transistor Tdr2 and the second light emitting diode device 300b.

The second emission control transistor Tem2 may include a gate electrode connected to the emission control line ECL, a drain electrode connected to the source electrode of the second driving transistor Tdr2, and a source electrode connected to an anode terminal of the second light emitting diode device 300b. Also, during the emission period, the second emission control transistor Tem2 may be turned on by the emission control signal supplied through the emission control line ECL and may supply a data current, output from the second driving transistor Tdr2, to the second light emitting diode device 300b.

The source electrode of the second emission control transistor Tem2, as illustrated in FIG. 4, may be connected to, through a second pixel electrode AE2, a first electrode E1 of the second light emitting diode device 300b disposed in a second concave portion 130b.

In the pixel circuit PC, one of the first and second current output parts COP1 and COP2 may be a redundancy pixel circuit which is previously provided in each of subpixels SP1 to SP3 for solving an operation defect of each of the first and second light emitting diode devices 300a and 300b provided in each of the subpixels SP1 to SP3.

The voltage initialization part VIP may pre-initialize the source electrode of the first driving transistor Tdr1 to the reference voltage Vref during the pre-initialization period, and during an initialization period, the voltage initialization part VIP may initialize the voltage stored in the storage capacitor Cst to the reference voltage Vref. The voltage initialization part VIP according to an embodiment may include a first transistor T1, a second transistor T2, and a third transistor T3.

The first transistor T1 may include a gate electrode connected to a second gate line GL2, a drain electrode connected to the second node N2, and a source electrode connected to the source electrode of the first driving transistor Tdr1. During the initialization period and the sampling period, the first transistor T1 may be turned on by a second gate signal supplied through the second gate line GL2 and may connect the gate electrode of the first driving transistor Tdr1 to the source electrode.

The second transistor T2 may include a gate electrode connected to the emission control line ECL, a drain electrode connected to a reference power line RL, and a source electrode connected to the first node N1. During the pre-initialization period and the initialization period, the second transistor T2 may be turned on by the emission control signal supplied through the emission control line ECL and may supply the reference voltage, supplied through the reference power line RL, to the first node N1.

The third transistor T3 may include a gate electrode connected to the second gate line GL2, a drain electrode connected to the reference power line RL, and a source electrode connected to a third node N3 connected to the source electrode of the first emission control transistor Tem1. During the initialization period and the sampling period, the third transistor T3 may be turned on by the second gate signal supplied through the second gate line GL2 and may supply the reference voltage, supplied through the reference power line RL, to the third node N3.

In an embodiment of the present disclosure described above, the pixel circuit PC of each subpixel is not limited to FIGS. 3 to 7. In other embodiments, the pixel circuit PC may further include at least one auxiliary transistor and at least one auxiliary capacitor for compensating for a threshold voltage of a driving transistor, in addition to a switching transistor and a current output part.

In addition, in an embodiment of the present disclosure described above, each subpixel has been described above as including two light emitting diode devices, but is not limited thereto. In other embodiments, each subpixel may include first to Nth (where N is a natural number equal to or more than two) light emitting diode devices and a pixel circuit including first to Nth driving transistors which respectively supply a data current to each of the first to Nth light emitting diode devices. In this instance, each subpixel may include one or N concave portions where each of the first to Nth light emitting diode devices is accommodated into one accommodation space or is individually accommodated.

As described above, in the light emitting diode display device according to the embodiments of the present disclosure, a screen defect caused by a defect of a micro light emitting device is prevented or reduced.

It will be apparent to those skilled in the art that various modifications and variations can be made in the present disclosure without departing from the spirit or scope of the disclosures. Thus, it is intended that the present disclosure covers the modifications and variations of this disclosure provided they come within the scope of the appended claims and their equivalents.

What is claimed is:

1. A light emitting diode display device comprising:
 a plurality of subpixels displaying an image with a data current based on a data signal, the plurality of subpixels each including:
  first to Nth light emitting diode devices emitting light with the data current, where N is a natural number equal to or greater than two;
  a pixel circuit including first to Nth driving transistors respectively supplying the data current corresponding to the data signal to the first to Nth light emitting diode devices;
  an insulation layer covering the pixel circuit;
  a planarization layer on the insulation layer; and
  an adhesive member between the insulation layer and the first to Nth light emitting diode devices,
  wherein each of the first to Nth light emitting diode devices includes:
   a first portion including a first electrode and a second electrode; and a second portion opposite to the first portion, and
wherein the adhesive member is interposed between the second portion of each of the first to Nth light emitting diode devices and the insulation layer.

2. The light emitting diode display device of claim 1, wherein when any one of the first to Nth light emitting diode devices have a defect, remaining light emitting diode devices of the first to Nth light emitting diode devices are used as a redundancy light emitting diode device.

3. The light emitting diode display device of claim 1, wherein each of the first to Nth light emitting diode devices is a micro light emitting diode device.

4. The light emitting diode display device of claim 1, wherein each of the first to Nth light emitting diode devices comprises:
a first semiconductor layer;
an active layer provided on one side of the first semiconductor layer; and
a second semiconductor layer provided on the active layer,
wherein the first electrode is provided on the second semiconductor layer, and
wherein the second electrode is provided on another side of the first semiconductor layer, and is physically separate from the active layer and the second semiconductor layer.

5. The light emitting diode display device of claim 4, wherein each of the plurality of subpixels further comprises:
a common electrode connected to the second electrodes of the first to Nth light emitting diode devices, and
first to Nth pixel electrodes respectively configured to connect the first electrodes of the first to Nth light emitting diode devices to the first to Nth driving transistors in a one-to-one relationship.

6. The light emitting diode display device of claim 4, wherein each of the plurality of subpixels further comprises first to Nth concave portions provided to the planarization layer for respectively accommodating the first to Nth light emitting diode devices, and
wherein the adhesive member is interposed between the first to Nth light emitting diode devices and the first to Nth concave portions.

7. The light emitting diode display device of claim 1, wherein the planarization layer comprises:
a first planarization layer disposed on the insulation layer; and
a second planarization layer disposed on the first planarization layer and the first to Nth light emitting diode devices,
wherein the first to Nth light emitting diode devices are embedded in the second planarization layer.

8. The light emitting diode display device of claim 1, wherein the pixel circuit comprises:
a switching transistor supplying the data signal, supplied through a data line, to a common node in response to a gate signal;
a first current output part including the first driving transistor supplying the data current, corresponding to the data signal supplied to the common node, to the first light emitting diode device; and
a second current output part including a second driving transistor supplying the data current, corresponding to the data signal supplied to the common node, to the second light emitting diode device,
wherein, the common node is shared by the first current output part and the second current output part.

9. The light emitting diode display device of claim 8, wherein the first current output part further comprises a first capacitor connected between a gate electrode and a source electrode of the first driving transistor, and
the second current output part further comprises a second capacitor connected between a gate electrode and a source electrode of the second driving transistor.

10. The light emitting diode display device of claim 1, wherein the pixel circuit comprises:
a switching transistor supplying the data signal, supplied through a data line, to a first node;
a storage capacitor including a first terminal connected to the first node and a second terminal connected to a second node;
a first current output part including a first driving transistor supplying the data current, corresponding to the data signal supplied to the second node, to the first light emitting diode device;
a second current output part including a second driving transistor supplying the data current, corresponding to the data signal supplied to the second node, to the second light emitting diode device; and
a voltage initialization part initializing a voltage of the first node and a voltage of the second node,
wherein, the first node is disposed between the switching transistor and the storage capacitor, and the second node is shared by the first current output part and the second current output part.

11. The light emitting diode display device of claim 10, wherein the first current output part further comprises a first emission control transistor connected between the first driving transistor and the first light emitting diode device, and
the second current output part further comprises a second emission control transistor connected between the second driving transistor and the second light emitting diode device.

12. The light emitting diode display device of claim 11, wherein the voltage initialization part comprises:
a first transistor connected between a gate electrode and a source electrode of the first driving transistor;
a second transistor connected between the first node and a reference power line through which a reference voltage is supplied; and
a third transistor connected between the reference power line and a third node between the first emission control transistor and the first light emitting diode device.

13. A display device comprising:
a plurality of subpixels each having a plurality of light emitting diodes including a first light emitting diode and a second light emitting diode,
an insulation layer under the first and second light emitting diodes;
a planarization layer on the insulation layer: and
an adhesive member between each of the first and second light emitting diodes and the insulation layer,
wherein each of the first and second light emitting diodes includes;
a first portion including a first electrode and a second electrode; and
a second portion opposite to the first portion,
wherein the first electrodes of the first and second light emitting diodes are commonly connected, and the second electrodes of the first and second light emitting diodes are commonly connected, and
wherein the adhesive member is interposed between the second portion of each of the first and second light emitting diodes and the insulation layer.

14. The display device of claim 13, wherein the second electrodes of the first and second light emitting diodes are commonly connected to a common electrode of the display device.

15. The display device of claim 13, wherein the second electrodes of the first and second light emitting diodes are commonly connected to a power line of the display device.

16. The display device of claim 15, further comprising a switching transistor, and first and second driving transistors connected to the switching transistor,
wherein the first electrodes of the first and second light emitting diodes are respectively connected to the first and second driving transistors.

17. The display device of claim 13, wherein a distance between the second electrodes of the first and second light emitting diodes is smaller than a distance between the first electrodes of the first and second light emitting diodes.

18. The display device of claim 13, wherein the planarization layer comprises:

a first planarization layer on the insulation layer; and
a second planarization layer on the first planarization layer and the first and second light emitting diodes,
wherein the second planarization layer covers the first and second light emitting diodes except for each of the first and second electrodes of the first and second light emitting 19. The light emitting diode display device of claim 1, wherein the planarization layer covers the first to Nth light emitting diode devices except for each of the first and second electrodes of the first to Nth light emitting diode devices.

20. The display device of claim 19, wherein the planarization layer comprises:

a first planarization layer on the insulation layer; and
a second planarization layer on the first planarization layer and the first to Nth light emitting diode devices,
wherein the second planarization layer covers the first to Nth light emitting diode devices except for each of the first and second electrodes of the first to Nth light emitting diode devices.

* * * * *